(12) United States Patent
Tamba et al.

(10) Patent No.: US 6,313,598 B1
(45) Date of Patent: Nov. 6, 2001

(54) POWER SEMICONDUCTOR MODULE AND MOTOR DRIVE SYSTEM

(75) Inventors: Akihiro Tamba, Hitachi; Toshio Ogawa, Hitachinaka; Kazuji Yamada, Hitachi, all of (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/463,591

(22) PCT Filed: Jun. 4, 1999

(86) PCT No.: PCT/JP99/02990

§ 371 Date: Jan. 28, 2000

§ 102(e) Date: Jan. 28, 2000

(87) PCT Pub. No.: WO00/16398

PCT Pub. Date: Mar. 23, 2000

(30) Foreign Application Priority Data

Sep. 11, 1998 (JP) .................................................. 10-257835

(51) Int. Cl.⁷ .................................................. H01L 25/04
(52) U.S. Cl. .......................... 318/722; 318/801; 361/728; 361/736; 361/772; 257/692
(58) Field of Search ..................... 318/722, 800, 318/801, 803; 361/728, 736, 748, 752, 760, 772; 257/678, 684, 687, 690, 692, 693

(56) References Cited

U.S. PATENT DOCUMENTS

| | | | |
|---|---|---|---|
| 5,124,888 | * | 6/1992 | Suzuki et al. .......................... 361/395 |
| 5,457,604 | * | 10/1995 | Ando ..................................... 361/707 |
| 5,497,289 | * | 3/1996 | Sugishima et al. ................... 361/709 |
| 5,777,851 | * | 7/1998 | Yamamoto ............................ 361/748 |
| 6,091,604 | * | 7/2000 | Plougsgaard et al. ............... 361/707 |

FOREIGN PATENT DOCUMENTS 3-272163-A * 12/1991 (JP) .
10-135405-A * 5/1998 (JP) .

* cited by examiner

Primary Examiner—Bentsu Ro
(74) Attorney, Agent, or Firm—Antonelli, Terry, Stout & Kraus, LLP

(57) ABSTRACT

A power semiconductor module comprising a power semiconductor element included in a power circuit portion and mounted on a metal base, a first resin molded to the power semiconductor element, a control circuit element disposed on the first resin and included at least in a portion of the control circuit, and a control terminal connected to the power circuit portion and having an exposed portion thereof in the surface of the first resin, in which a portion of the control circuit is connected with the power circuit portion at the exposed portion of the control terminal. Accordingly, a resin mold type power semiconductor module capable of realizing a high performance of the control circuit portion at low cost can be realized.

23 Claims, 14 Drawing Sheets

F I G. 11
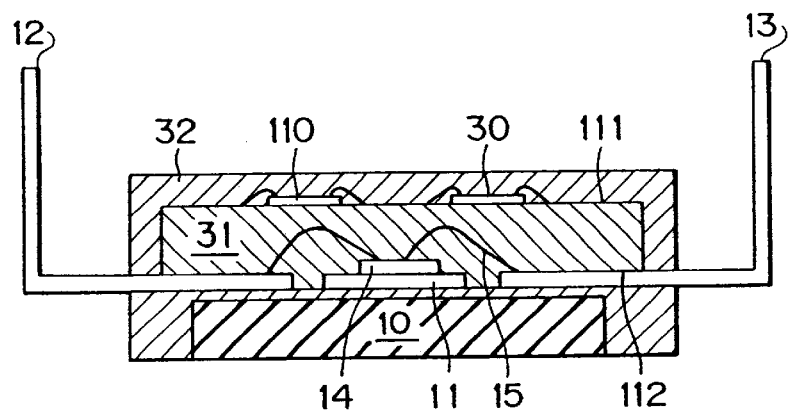
F I G. 12
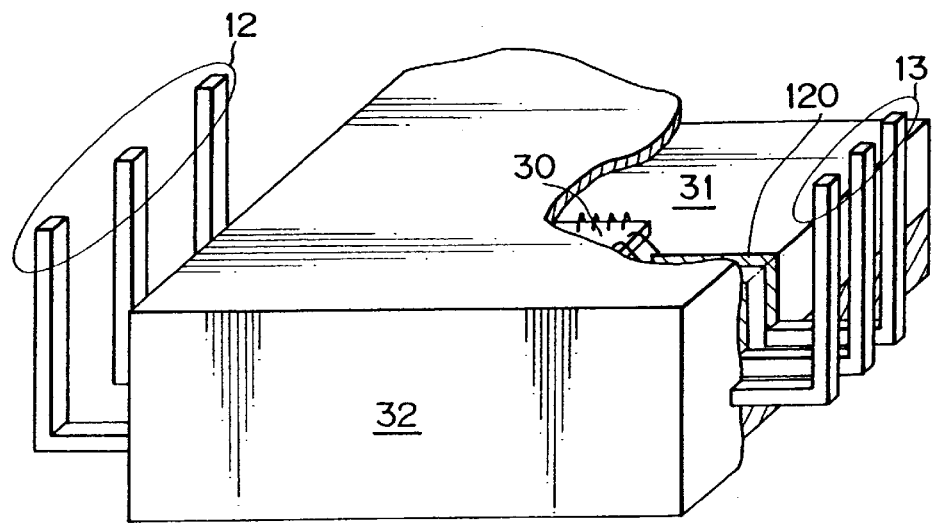

F I G. 23
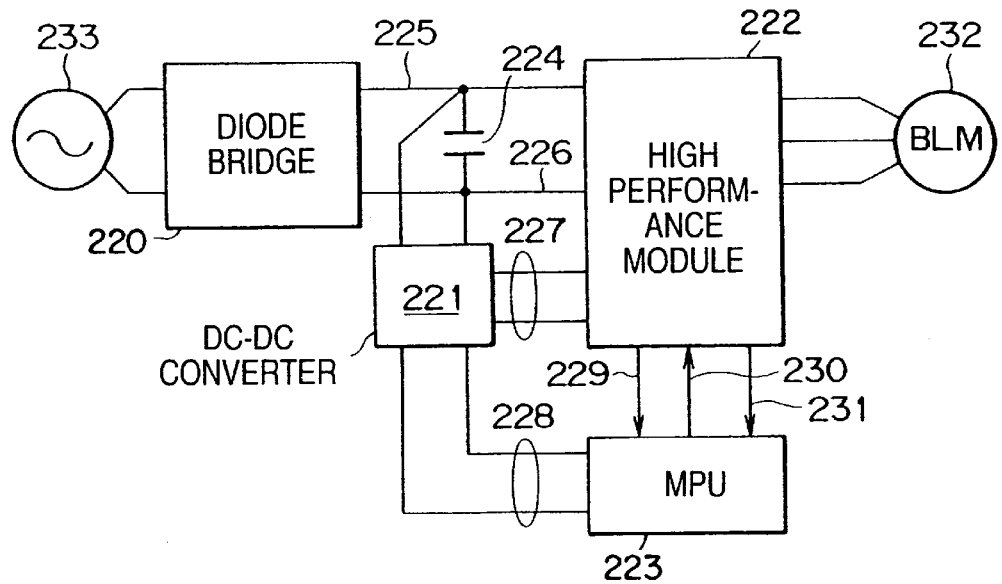
F I G. 24
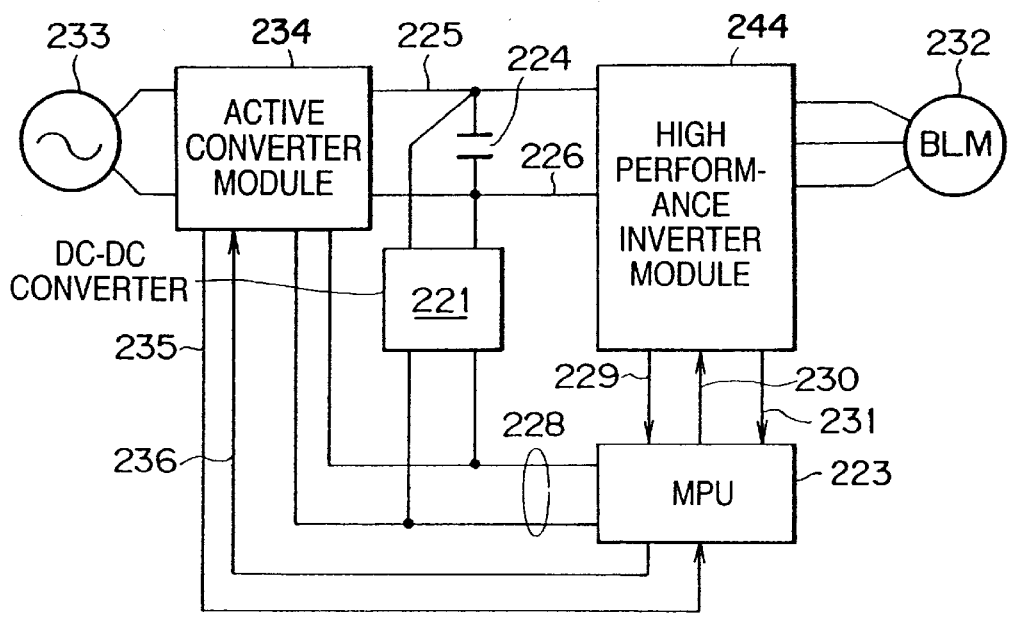

POWER SEMICONDUCTOR MODULE AND MOTOR DRIVE SYSTEM

TECHNICAL FIELD

The present invention relates to a structure of a power semiconductor module incorporating peripheral circuits.

BACKGROUND OF THE INVENTION

As one of the means for decreasing the cost of a power semiconductor module, it is possible to fabricate the package by transfer molding as in the fabrication of an IC package. Power semiconductor modules having cross-sectional structures as shown in FIG. 3 and FIG. 20 are typical examples.

FIG. 3 shows an IGBT module incorporating a driver (three-phase inverter module) produced by mounting six elements, each including an IGBT and flywheel diode (FWD), and four chips having a gate drive IC (incorporating various protecting circuits) for the IGBT, on a lead frame 11 and subjecting the same to transfer molding. The bare chip power elements (IGBT, FWD) 14 and the bare chip gate drive ICs 30 are mounted on a common lead frame 11 serving as both a power system terminal 12 and a control terminal 13, and electrical interconnections are made with Al (aluminum) wires 15, and then the same is subjected to transfer molding (first molding) with a thermosetting resin 31. Then, the same and a heat radiating plate 10 together are subjected to transfer molding with a thermosetting resin 32 (second molding). Further, insulating work between the lead frame 11 and the heat radiating plate 10 is performed with the thermosetting resin 32 at the same time as the second molding. Hence, a resin containing a large quantity of alumina filler is used as the thermosetting resin 32 for reducing the heat resistance.

According to the IGBT module as described above, the only parts used other than the Si chip are the lead frame 11, the heat radiating plate 10, and the sealing resin. Hence, it has an advantage of being fabricated at low cost.

FIG. 20 shows an example of a hybrid IC mounting power elements thereon. Namely, it shows a technique for attaining a performance higher than the IGBT module incorporating a driver shown in FIG. 3. There are mounted bare chip power elements 14 and a thick film circuit board (alumina) 202 on a lead frame 200. A flip-chipped IC 201 is mounted on the thick film circuit board 202, whereby a thick film resistor and the like and a high performance circuit are formed. The power element 14 and the thick film circuit board 202 are connected to the lead frame 200 with an Al wire 15 and subjected to transfer molding with a thermosetting resin 16. Since, as opposed to the case of FIG. 3, this example uses the thick film circuit board 202 in addition to the lead frame 200, it has a characteristic feature of attaining a higher performance.

The above described transfer mold type power modules have the following problems in terms of compatibility between achievement of high performance of the module and reduction in the fabrication cost and, further, in terms of reliability of the module.

In the case of the IGBT module shown in FIG. 3, the electrical wiring pattern is provided by only the lead frame 11. Hence, the number of components can be decreased and the fabrication process can be greatly simplified. It, therefore, has a structure well designed in terms of fabrication cost. However, in order to lower the resistance of the power system terminal 12, it is impossible to decrease the thickness of the lead frame 11 and, therefore, a fine pattern of the lead frame 11 cannot be produced. Accordingly, the control circuit that can be mounted is limited to a circuit not requiring a fine pattern. Namely, it is limited to such a circuit as an IGBT module incorporating a driver mounting only a gate drive IC thereon as in the case of FIG. 3. Further, since it is not necessary to consider heat radiation therefrom, the gate drive IC 30, in itself, is a part not required to be mounted on the lead frame 11. Hence, this means that the area of the module increases by a region occupied by the gate drive IC 30. This is unfavorable from the point of view of fabrication cost when transfer molding, to which miniaturization is the key, is executed.

On the other hand, in the case of the structure shown in FIG. 20, a fine pattern can be easily produced for the control circuit because the thick film circuit board 202 serving as the control circuit is mounted on the lead frame constituting the power system terminal. Hence, a high performance IC such as an MPU can be incorporated therein. However, the area of the lead frame 200 becomes large and there arises the same problem as the case described above in view of the fabrication cost.

Further, as a problem common with FIG. 3 and FIG. 20, it can be mentioned that they are both vulnerable to noises. Since both the control circuit and the power element are mounted on the same lead frame, capacity coupling is caused between the power element 14 and the control circuit (the gate drive IC 30 or the thick-film circuit board 202) through the lead frame or the radiating plate and the circuit is easily affected by noise due to potential changes in the power element 14.

SUMMARY OF THE INVENTION

The invention was made in view of the above described problems and it provides a power semiconductor module which, while attaining higher performance, has a low-cost or high reliability characteristic.

The power semiconductor module according to the invention comprises a power semiconductor element included in a power circuit portion and mounted on a metal base through an insulator and a first resin molded to the power semiconductor element such that the surface of the metal base is exposed. On the first resin, there is disposed a control circuit element included at least in a portion of the control circuit. Further, the power semiconductor module has a control terminal connected to the power circuit portion and an exposed portion in the surface of the first resin. At least a portion of the control circuit is connected with the power circuit portion at the exposed portion of the control terminal.

According to the present invention, since the control circuit element is disposed on the first resin molded to the power semiconductor element, it is possible to attain a higher performance control circuit not affected by the structure of the power circuit portion. Further, since the power semiconductor module according to the present invention is of a resin-mold type, it can be fabricated at low cost. Further, since the control circuit portion is disposed on the first resin that is molded to the power semiconductor element mounted on a metal base, the control circuit is hardly affected by noise from the power circuit portion. Therefore, the reliability can be improved.

A power converting apparatus such as an inverter and a converter can be structured by the use of the power semiconductor module according to the above-described invention. Motor driving systems for driving motors constructed of such a power converter apparatus have a characteristic feature of being fabricated at low cost or having a high reliability.

BRIEF DESCRIPTION OF DRAWINGS

FIG. 11 is a schematic diagram of an embodiment in which a control circuit wiring is provided on a resin package by three-dimensional printing.

FIG. 12 is a perspective view of the three-dimensional wiring shown in FIG. 11.

FIG. 23 is a block diagram of an embodiment of a brushless motor driving apparatus.

FIG. 24 is a block diagram another embodiment of a brushless motor driving apparatus.

BEST MODE FOR CARRYING OUT THE INVENTION

Embodiments of the present invention will be described in detail with reference to the accompanying drawings.

Embodiment 1

Figure 1:
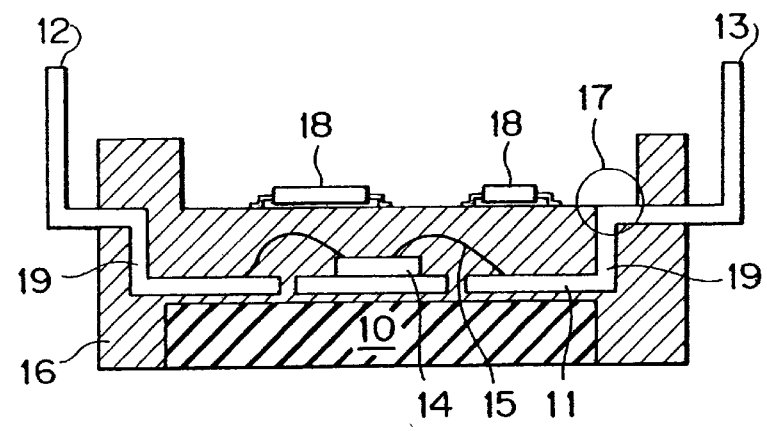
FIG. 1 is a schematic diagram showing a cross-sectional structure of an embodiment of the invention.

An embodiment of the invention will be described with reference to the accompanying drawings. FIG. 1 is a schematic diagram showing a cross-sectional structure. A power semiconductor element 14, such as an IGBT, is connected to a lead frame 11 by ultrasonic wire bonding with an Al wire 15. A power system terminal (main terminal) 12 and an input terminal (control terminal) 13 are constituted of the lead frame 11 having the power semiconductor element 14 mounted thereon. This serves to reduce the cost of parts and fabrication by the use of one single lead frame. In the present embodiment, the thickness of the lead frame 11 is made as thick as 0.8 mm for lowering the resistance of the power system wiring. The power semiconductor element 14 attached to the lead frame 11 must be insulated from a metal base 10 serving as a heat radiating plate by some means or other. In the present embodiment, it is insulated by a thermosetting resin 16 and the same, together with the metal base 10, is subjected to transfer molding. The gap between the lead frame 11 and the metal base 10 is required to be made as thin as possible within limits not impairing the reliability of the dielectric strength. This is for allowing the heat of the power semiconductor element 14 to be effectively radiated by means of heat radiating fins attached to the metal base 10. Taking this point into consideration, in the present embodiment, the thickness of the thermosetting resin 16 between the lead frame 11 and the metal base 10 is set at 0.4 mm.

The lead frame 11 is set upright within the package (PKG) (at the region 19) to secure its distance from the fin so that insulation of it from the earth (ground) is ensured. A recess around 6 mm deep is formed in the top face of the PKG and the control terminal 13 is partly exposed at its region 19 at the bottom of the recess (region 17). The recess formed in the top surface of the PKG is an area for disposing circuits for controlling the power semiconductor element 14 thereon and reference numeral 18 denotes a control circuit element. The control circuit portion is electrically connected with the control terminal of the power semiconductor element 14 in the region 17. By the structure as described above, it is possible to realize a so-called high performance power module incorporating various control functions in the same planar area as that of a power module having only a power semiconductor element sealed therein.

Figure 2:
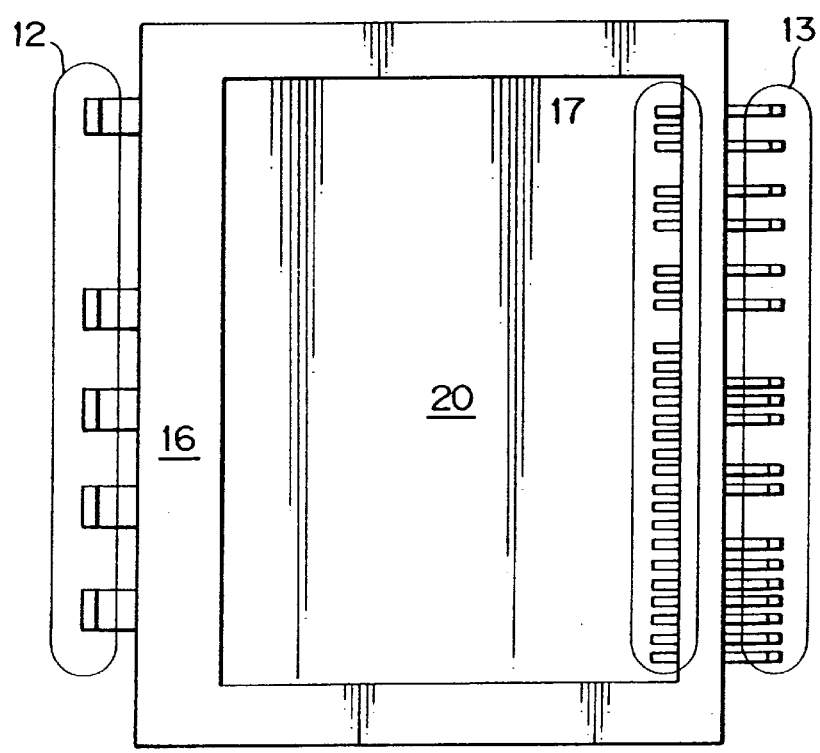
FIG. 2 is a schematic diagram showing a planar structure of the embodiment shown in FIG. 1.

FIG. 2 is a schematic planar structural drawing of the PKG as seen from above, in which the control circuit element 18 and the sealing material therefor are omitted. The region 20 is used for mounting the control circuit thereon and external input terminals 13 and other control terminals are exposed in the region 17. On the surface of the thermosetting resin 16 in the region 20, there is formed a metal foil serving as the wiring for the control circuit element. As apparent from the drawing, most of the planar dimension of the PKG can be used as the region for mounting the control circuit thereon. Therefore, not only the gate drive IC as in the prior art intelligent power module (IPM), but also such parts as the MPU for controlling the same, can be mounted thereon.

Figure 5:
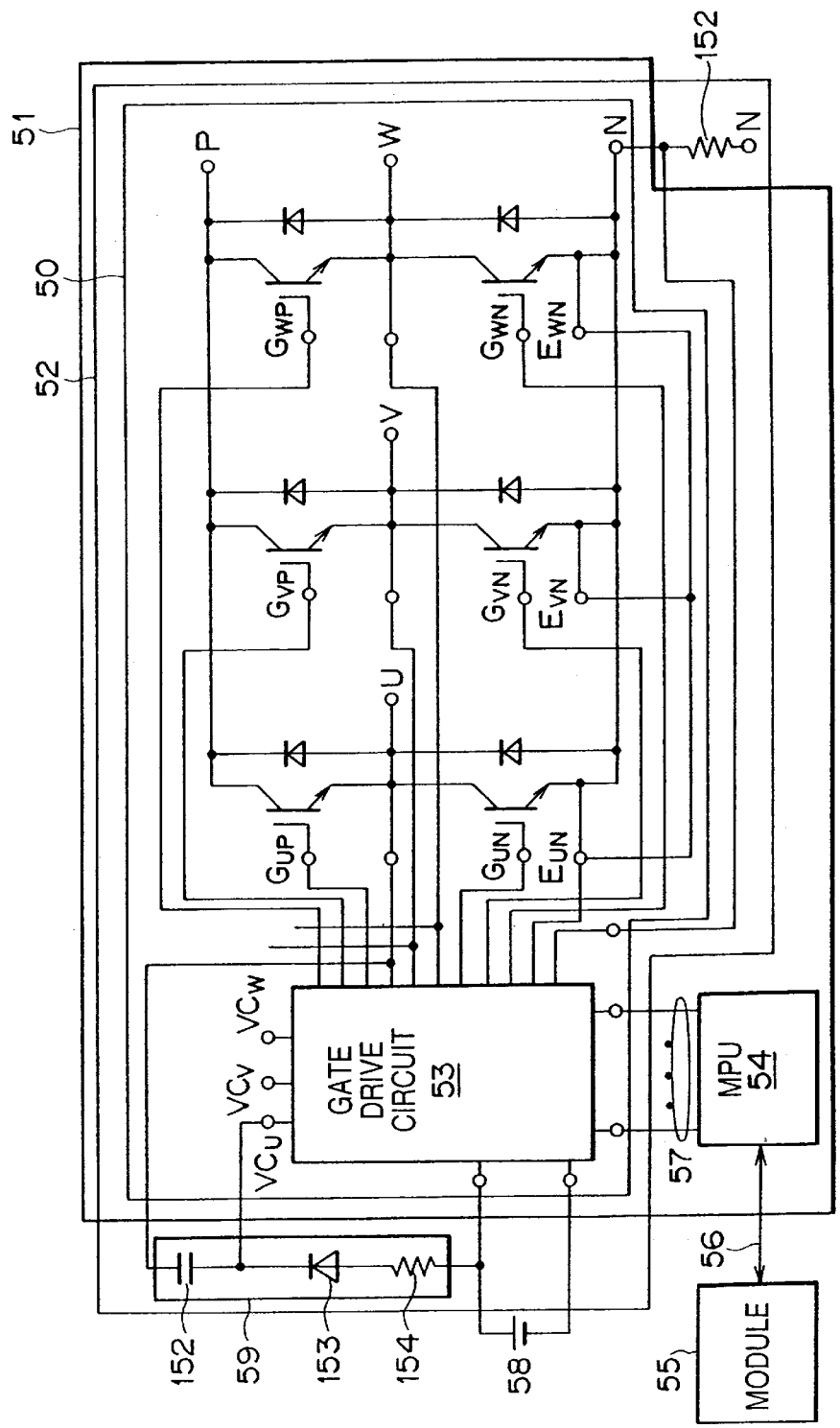
FIG. 5 is a schematic diagram of an equivalent circuit of a high performance IGBT module.
Figures 6A, 6B:
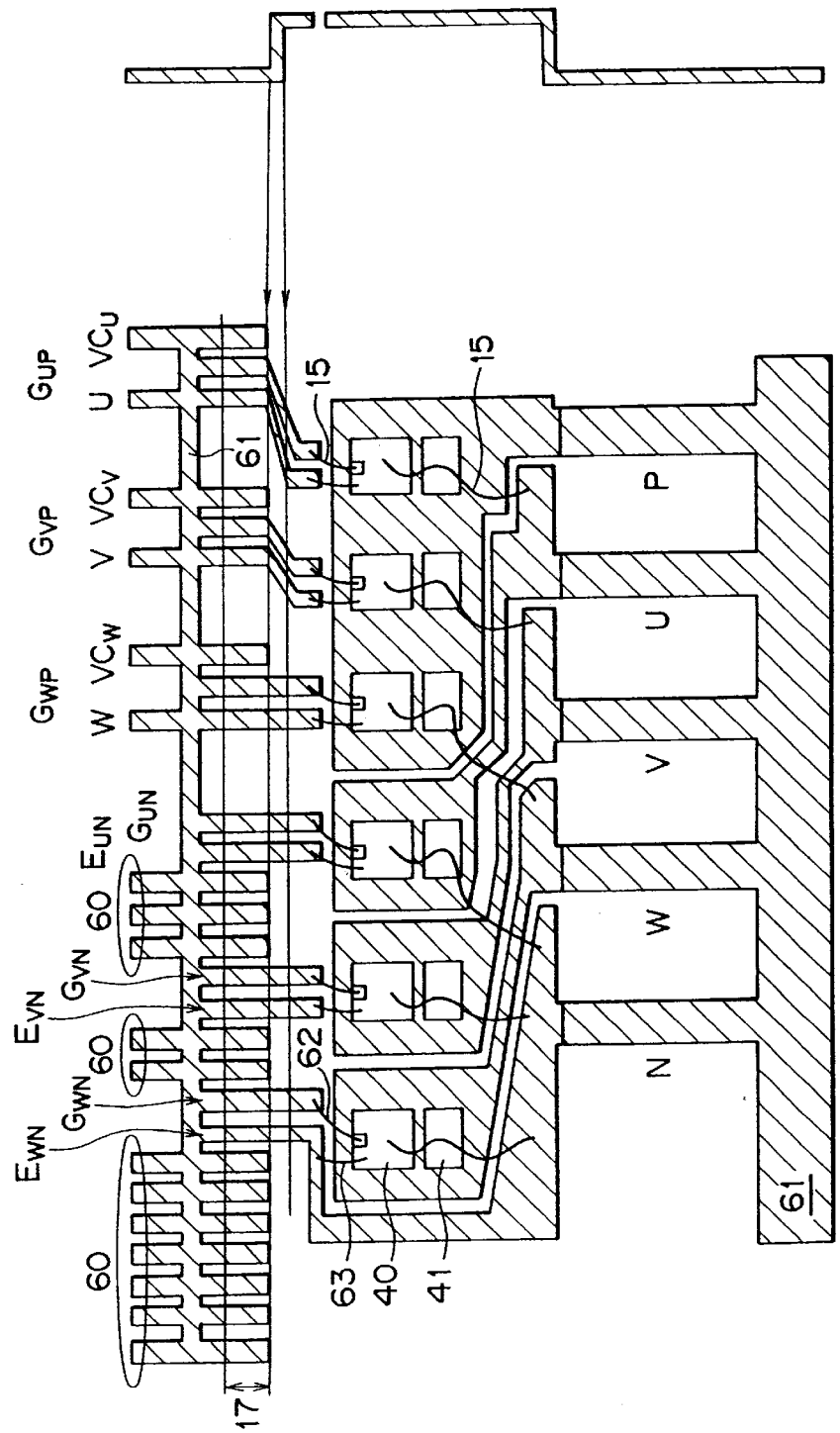
FIG. 6A is a plan view and FIG. 6B is a side view of an embodiment of the shape of the lead frame in FIG. 4.

FIG. 6A shows an example of the lead frame. It is an example of a three-phase inverter module, in which the power circuit portion is a three-phase inverter having six pieces made up of the IGBTs 40 and the FWDs (free wheel diodes) 41 mounted thereon. FIG. 6A is a schematic plan view showing the IGBTs 40, FWDs 41, and Al wires 15, while FIG. 6B is a sectional view thereof. Only a portion of the tie bar 61 connecting the lead frame is shown in the drawing. The names of the terminals of the lead frame connected with the gate wire 62 and the control system emitter wire 63 in the drawing correspond to the names of the terminals in the equivalent circuit diagram of FIG. 5.

Other control terminals 60 are external input and output terminals. As apparent from the drawing, the power system wiring and the control system wiring are constructed of one lead frame. The size of the lead frame is approximately 6 cm×5 cm. What is characteristic of it is that the input and output terminals 60 are constructed of the lead frame for connection with the control circuit in the region 17, while the IGBTs 40 and the FWDs 41 are not directly connected with them.

Embodiment 2

Figure 4:
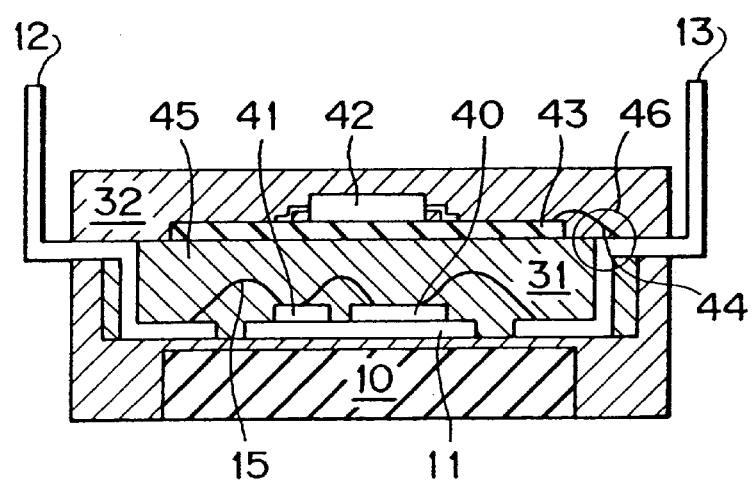
FIG. 4 is a schematic diagram which shows an embodiment of an IGBT module incorporating a driver.

FIG. 4 shows an embodiment of an IGBT module incorporating a gate drive circuit made up of IGBTs 40, FWDs 41, gate drive ICs 42 for driving the IGBT, and their peripheral circuits. It corresponds to the portion indicated by the region 50 in the system configuration drawing of FIG. 5. In FIG. 5, the gate drive circuit is denoted by reference numeral 53.

As in the embodiment 1, the IGBTs 40 and FWDs 41 as the power semiconductor elements are soldered to the lead frame 11, electrical connections are made with Al wires 15, and they are resin-sealed with a thermosetting resin 31. The control terminals 13 are partly exposed in the top surface of the thus sealed PKG 45 (region 46). The resin 31 forming the PKG 45 is that having a comparably large coefficient of linear expansion (approximately 16 to 20 ppm/° C.) because there is no need for considering heat conduction to the radiating plate 10 and, hence, no need for containing a large quantity of alumina filler. Since the alumina filler presents a danger of damaging the sealed semiconductor chip and producing defective products, the use of the resin 31 having a large coefficient of linear expansion also contributes to a high yield. The control circuit is formed of a printed circuit board (PCB) 43 and has a gate drive IC 42, as its main control circuit element, soldered onto the PCB 43. By having the PCB 43 attached onto the PKG 45 with a thermosetting silicone adhesive and having an electrode pattern formed on the PCB 43 and the control system lead frame wire-bonded with an Al wire 44, the control circuit and the IGBT are electrically connected with each other. Of course, a gold wire may be used instead of the Al wire. The PKG 45 to which the PCB 43 is bonded and the Al base 10 as the radiating plate 10 together are subjected to transfer molding. The transfer molding resin 32, are opposed to the resin 31, contains a large quantity of alumina filler and has a high heat conductivity. This has the purpose of increasing heat radiation because the transfer molding resin 32 is also used as an insulating means between the lead frame 11 and the radiating plate 10. The gap between the lead frame 11 and the Al base 10 is set at 0.2 mm.

The module according to the present embodiment has a length of approximately 2 cm in the direction of its short side and it can greatly decrease the size as compared with the size of 3.5 cm of the prior art having the gate drive IC mounted on the lead frame.

Embodiment 3

Figure 7:
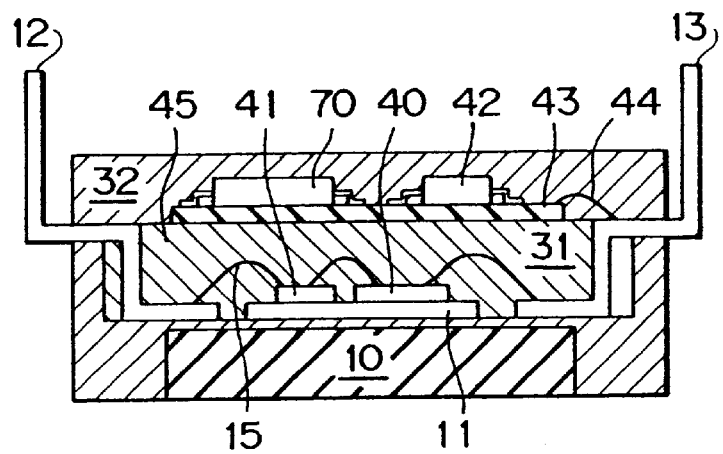
FIG. 7 is a schematic diagram of an embodiment of an IGBT module incorporating a microcomputer.

An embodiment which incorporates an MPU performing such functions as generating a PWM signal for controlling the gate drive IC is shown in FIG. 7. This is a module corresponding to the region 51 in the system structural drawing in FIG. 5. FIG. 7 is a schematic diagram showing the cross-sectional structure. The MPU is denoted by reference numeral 54 in FIG. 5.

Figure 3:
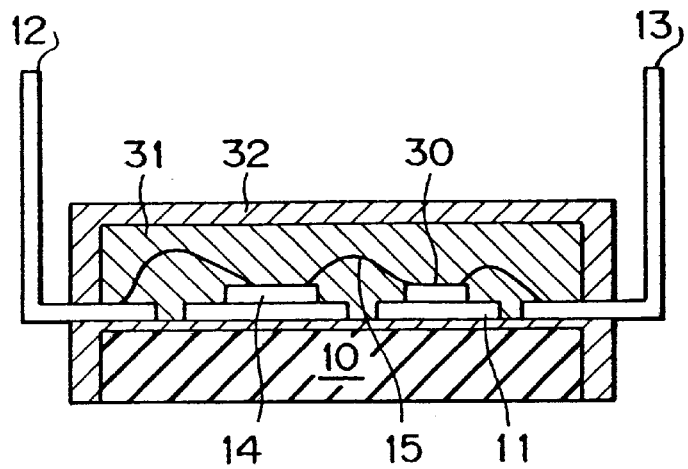
FIG. 3 is a schematic diagram showing a cross-sectional structure of a prior device.

The structure is completely the same as that shown in the embodiment 2. Since it, as opposed to the prior device shown in FIG. 3, has the PCB 43 mounted thereon, a micro-miniaturized wiring pattern can be easily formed. Therefore, an MPU 70 requiring a micro-miniaturized wiring pattern can be easily mounted on the PCB 43. Further, since the PCB 43 disposed on the entire surface of the PKG 45 can secure a sufficiently large region for mounting the MPU 70 thereon, the PCB 43 is prevented from becoming larger.

Accordingly, the module size does not become large and the length in the direction of the short side can be set at approximately 2 cm.

Embodiment 4

Figure 8:
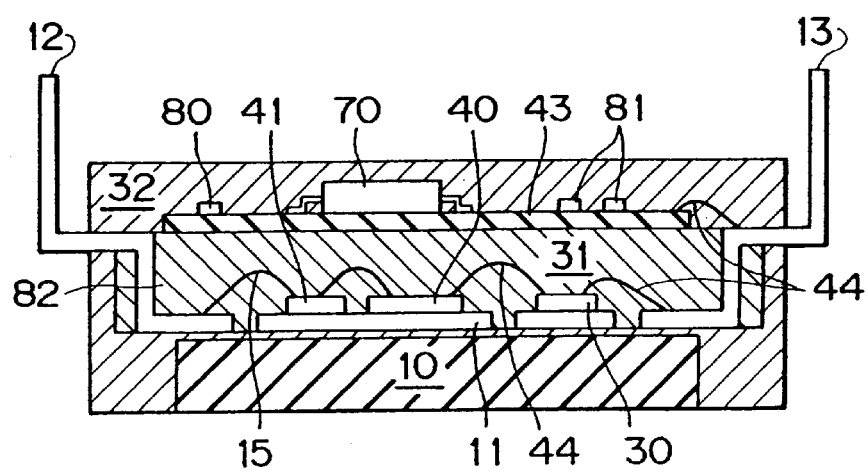
FIG. 8 is a schematic diagram of another embodiment of an IGBT module incorporating a microcomputer.

The gate drive IC 42, as opposed to the MPU 70 as a control IC, is smaller in scale and has a smaller number of terminals. Accordingly, there is shown, in FIG. 8, an example of a module realizing the function performed in the region 51 shown in FIG. 5 obtained by having the gate drive IC disposed on the lead frame, the same as in the prior device shown in FIG. 3. The drawing shows a cross-sectional structure.

The IGBTs 40 and the FWDs 41 are soldered to the lead frame 11 and, further, a bare chip gate drive IC 30 is soldered to the same. The lead frame 11, the power semiconductor elements, and the gate drive IC 30 are electrically interconnected with Al wires 15 and, then, resin-sealed with a thermosetting resin 31. In the top surface of the sealed PKG 82, a portion of the control terminal 13 is exposed in the same manner as in the above described embodiments. The control circuit is formed of a PCB 43 mounting thereon, as control circuit elements, an MPU 70, a chip resistor 80, a chip capacitor 81, and the like. In the case of the present embodiment, as opposed to that shown in FIG. 7, the PCB 43 mounts thereon only the MPU 70 and its peripheral circuit and, therefore, it can mount the one capable of higher functioning as the MPU 70 thereon. Thus, as opposed to the prior art having only the gate drive IC, a module having a considerably higher performance and which is easy to use can be realized.

Embodiment 5

Figure 9:
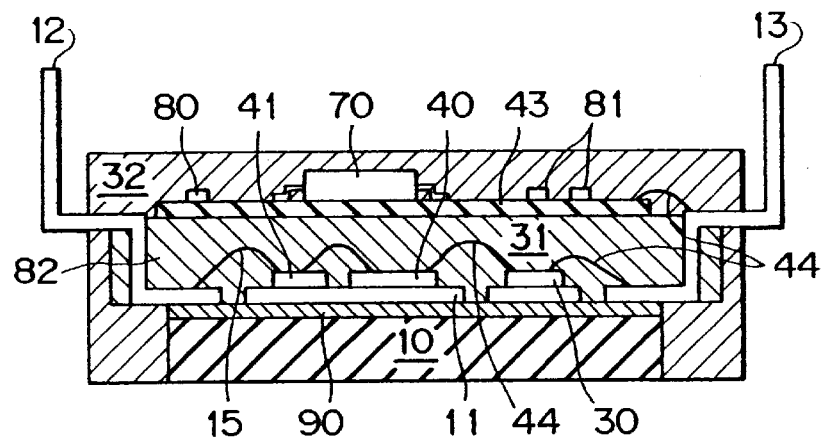
FIG. 9 is a schematic diagram of an embodiment in which a high heat-conductive adhesive sheet is used.

In all of the above described embodiments, insulation between the lead frame 11, i.e., the power semiconductor elements, and the Al base 10 was provided with a sealing resin. The advantage obtained from such an arrangement is that the fabrication cost can be kept low because there is no need for using special insulating materials. However, with this technique it is difficult to largely reduce the thermal resistance. This is because the quantity of alumina filler which can be mixed in the resin is limited by the requirement of securing the fluidity of the resin and, hence, the thermal conductivity cannot be reduced so much and because a relatively large gap, larger than 0.2 mm for example, is required under the lead frame for allowing the resin to be certainly filled therein. Accordingly, an example capable of reducing the thermal resistance is shown in FIG. 9, which is a schematic diagram showing a cross-sectional structure.

The structure of the present embodiment is the same as that in the embodiment 4 in that a PCB 43 constituting the control circuit is attached onto a PKG 82 having IGBTs 40, FWDs 41, and bare chip gate drive ICs 30 resin-sealed therein and interconnections are made with Al wires 44. The present embodiment has a characteristic in that it uses a thermocompression insulating sheet 90 for insulating the lead frame 11 from the Al base 10. The sheet is formed of an extra-thin (0.12 mm for example) resin containing a large quantity of alumina filler. By pressing the PKG 82 against the Al base 10 while the Al base 10 is heated, both the members are bonded together. Because of the above-described characteristic, the thermal resistance can be greatly reduced. While the thermal resistance Rth (j–c) from the junction of an IGBT of a rated current of 15A to the Al base is 2.5° C./W, the value in the present embodiment is Rth (j–c)=1.8° C./W. Therefore, this embodiment provides advantages in that the height of the fin can be greatly reduced and, hence, an advantage is obtained therefrom that the system fabrication cost can be greatly reduced.

Embodiment 6

Figure 13:
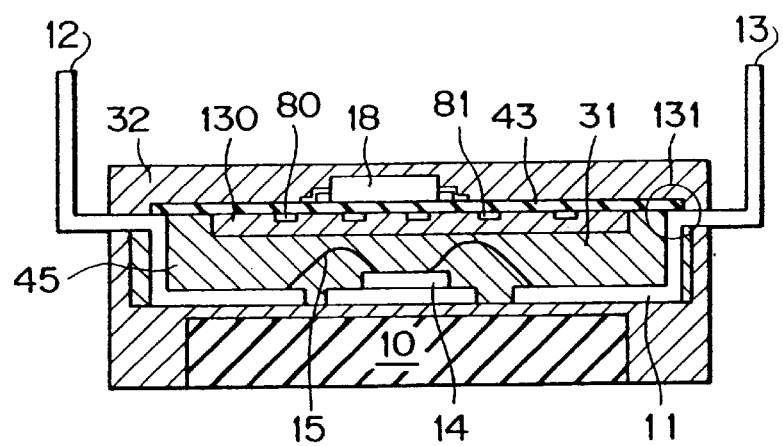
FIG. 13 is a schematic diagram of an embodiment meeting requirements for dual-sided mounting on a printed board.
Figure 14:
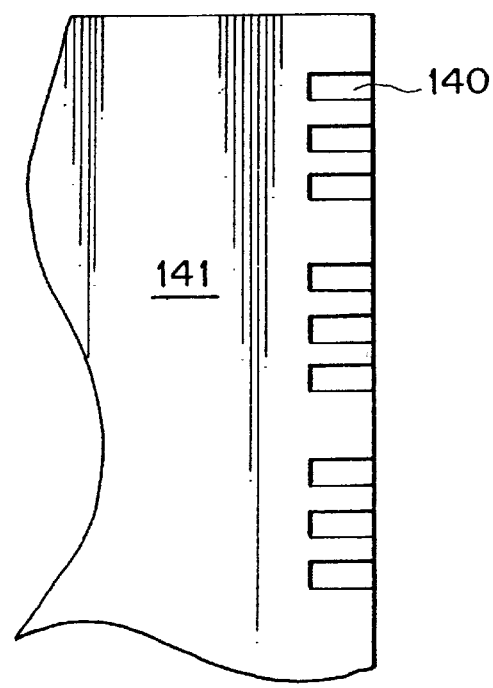
FIG. 14 is a schematic diagram of a PCB used in the embodiment shown in FIG. 13.

The embodiments described above are of a structure wherein the control circuit is formed of a PCB and that components are mounted only on one side of the PCB. The main reason for that is to ensure the adhesion on the back side of the PCB. When mounting components on a PCB with a high density, it is the general practice to solder components to both sides of the PCB. In the power semiconductor module of the present invention, with the arm of achieving a smaller size and higher performance of the module, thereby achieving reduction of fabrication cost and improvement of reliability of the product, the effect of the invention will be greatly enhanced if dual-sided mounting on the PCB can be carried out. FIG. 13 and FIG. 14 show an embodiment which achieves the purpose. FIG. 13 is a schematic diagram showing the cross-sectional structure, and FIG. 14 is a schematic diagram showing the electrode pads on the rear side of the mounting PCB.

The PKG 45 obtained by subjecting power semiconductor elements 14 soldered to the lead frame 11 to transfer molding with a thermosetting resin 31 has the same structure as in the above described embodiments. The characteristic feature of the present embodiment is the recess 130 of approximately 3 mm deep formed in the top face of the PKG 45, i.e., in the top face of the thermosetting resin 31. On the PCB 43 constituting the control circuit, there are mounted, as shown in the drawing, the control circuit IC 18 and many other components for surface mounting, such as chip resistors 80 and chip capacitors 81. Passive elements, such as the chip resistor 80 and the chip capacitor 81, are soldered to the back side of the PCB 43. The recess 130 is a hollow portion in which to dispose these parts when the PCB 43 is arranged on the top face of the PKG 45. Since thickness of the chip resistor 80 and the chip capacitor 81 is generally 1 mm or so, a depth of 3 mm or so is sufficient. Of course, when other components such as an IC PKG is mounted on the rear side, the depth must be made larger corresponding to the thickness of the same. By virtue of the provision of the recess 130, stabilized arrangement of the dual-side mounted PCB 43 becomes possible.

Another characteristic of the present embodiment is the method of connecting the PCB 43 with the lead frame. While the connection was made by wire bonding in the above-described embodiments, the PCB 43 is soldered to the lead frame at the region 131 in the present embodiment. On the rear side of the PCB 43, the electrode pads 140 are formed as shown in FIG. 14 for connection with the control terminals 13, formed of the lead frame, of the power semiconductor elements 14. The width of the pads is virtually equal to the width of the lead frame soldered thereto. It is 2 mm in the present embodiment. The pads and the lead frame are soldered to each other with a cream solder. A solder resist 141 is applied to other portion than the electrode pads 140 and, thereby, stabilized soldering can be performed. The soldering also serves for fixation of the PCB 43. Namely, an adhesive agent for bonding the PCB 43 is not required in the present embodiment but the region 131 also serves for fixation of the PCB 43.

Embodiment 7

Figure 15:
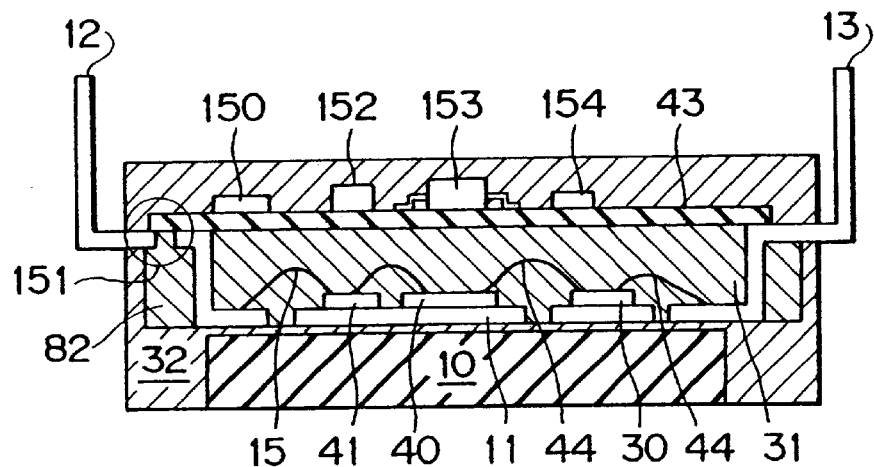
FIG. 15 is a schematic diagram of an embodiment incorporating a shunt resistor for current detection, a diode for a bootstrap circuit, a capacitor, and a resistor.

An IGBT module incorporating a driver in general requires four power sources (three power sources on the high side and one power source on the low side). However, it is known that they can be replaced, for reducing the system cost, with one power source in an IGBT module incorporating a gate drive IC of a low capacity (less than 20 A, for example) by making the gate drive IC endurable to high voltage and by using a circuit called a bootstrap circuit (denoted by 59 in FIG. 5). An embodiment incorporating the bootstrap circuit is shown in FIG. 15.

The PKG 82 obtained by sealing in a lead frame having the IGBTs 40, the FWDs 41, and the bare chip gate drive ICs 30 mounted thereon is the same as that in the above described embodiments. In the present embodiment, a bootstrap circuit is mounted by surface mounting on the PCB 43 on the upper side of the PKG 82. In FIG. 15, the bootstrap circuit comprises the high withstand voltage diode 153, the chip capacitor 152, and the chip resistor 154, respectively. In the present embodiment, there is mounted, in addition to the bootstrap circuit, a current detecting shunt resistor 150 on the PCB 43. The shunt resistor 150 is connected in series with the N terminal as the ground terminal of the power system terminal 12 for detecting the current value according to the voltage across the shunt resistor. Namely, the lead frame constituting the N terminal is cut in the region 151 and the chip resistor 150 is inserted in it to be incorporated therein.

According to the present embodiment, an IGBT module incorporating a driver which further incorporates a bootstrap circuit can be realized without increasing the module size. Further, of the control power supply terminals, only the power supply terminal on the low side is needed and the power supply terminal on the high side is not needed. Namely, a module whose control terminals are smaller than before by six pins can be realized.

Embodiment 8

Figure 16:
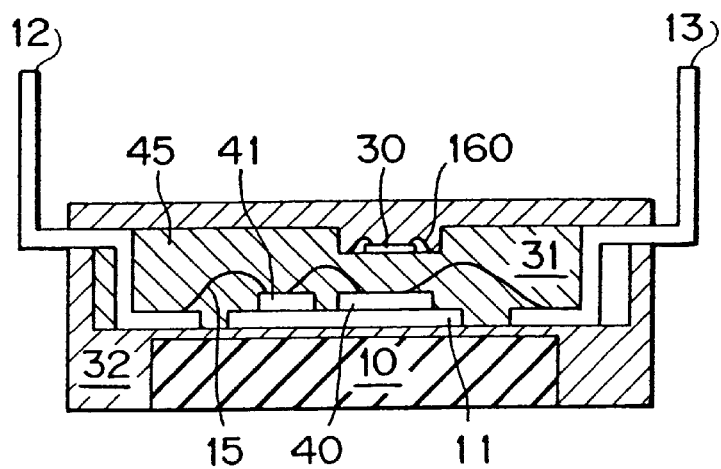
FIG. 16 is a schematic diagram of an embodiment in which a recess for disposing a control chip thereon is formed just above an IGBT chip.

FIG. 16 schematically shows a cross-sectional structure of an embodiment mounting thereon a gate drive IC, which has a higher performance and is integrated with a high density.

On the top side of the above described PKG 45, there is formed a recess 160 for mounting a bare chip gate drive IC 30 thereon. For example, in the case of a three-phase inverter module where each IGBT is driven by one gate drive IC, six recesses 160 are formed in one module. Further, on the surface of the thermosetting resin 31 in the recess, there is formed a wiring for the gate drive IC 30 using copper plating and the plated wiring is extended to the position of the input and output terminal 13 to be connected therewith. The thickness of the plating is 35 gm the same as the copper pattern on a general PCB and there arises no problem of the wiring resistance in the control circuit. The connection of the IC 30 to the copper plated wiring is carried out by gold wire bonding. The recess 160 serves a dual purpose. One is for making it easy to determine the mounting position for the gate drive IC 30. The other is to set the mounting position just above the IGBT 40 or the FWD 41 and incorporate a temperature detection means in the gate drive IC 30 so that the temperature of each element may be detected. In an ordinary module incorporating a driver, one temperature detection means is provided for one module. Then, when current is concentrated into an arm due to motor lock or the like, a problem arises in that an element far away from the temperature detection means cannot be protected. Since, in the present embodiment, the element can be protected by means of the gate drive IC 30 incorporating a temperature detection means positioned very close to each IGBT, this problem can be solved. Further, by having a current detection means incorporated in the gate drive IC 30 for detecting the current flowing through the IGBTs 40 and FWDs 41, it becomes possible to detect the phase currents.

Embodiment 9

Figure 19:
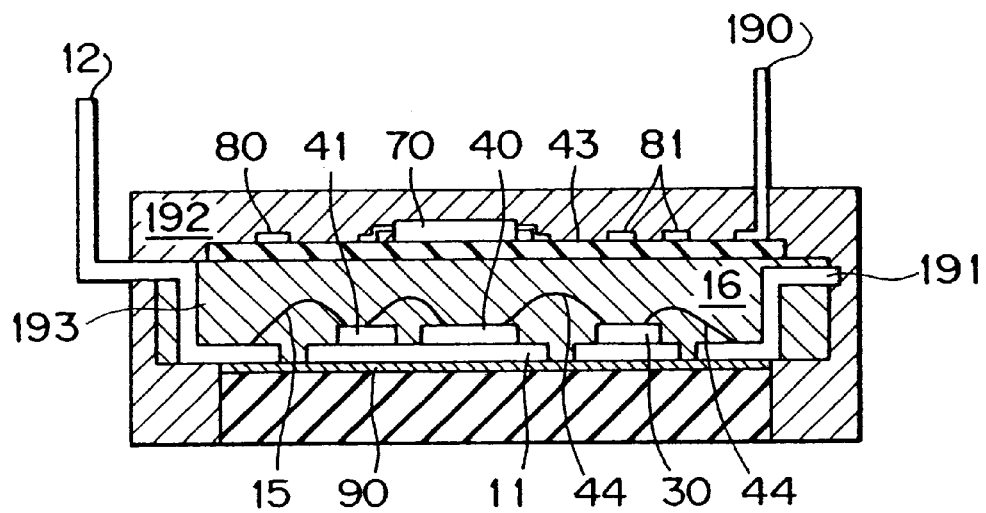
FIG. 19 is a schematic diagram of an embodiment in which a control terminal is disposed on a PCB.
Figure 20:
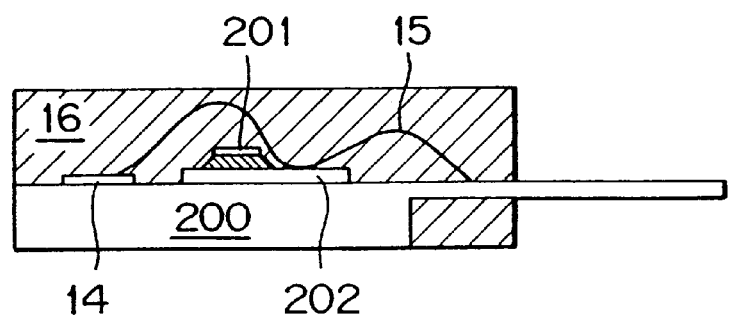
FIG. 20 is a schematic diagram showing a cross-sectional structure of a prior device.

The structure shown in FIG. 19 is that of an embodiment in which the external input and output terminal of the control system is formed of another terminal than the lead frame. IGBTs 40, FWDs 41, and bare chip gate drive ICs 30 are mounted on the lead frame 11 and they are subjected to transfer molding with a thermosetting resin 16. The arrangement of the control system lead frame having its part exposed in the upper face of the PKG is the same as in the foregoing embodiments. The difference from the foregoing embodiments is that the lead frames 11 of the control system are all cut off at the end of the PKG (region 191) after being subjected to transfer molding. The PKG 193 is bonded to the Al base 10 by the aforesaid thermocompression insulating sheet 90. The external input and output terminal is soldered onto the PCB 43 disposed on the upper surface of the PKG 193. The terminal 190 is the external input and output terminal. The terminals are formed for example of a terminal block having a size of 0.63 mm square arranged at a pitch of 2.54 mm. The terminal block can be easily arranged into various user-oriented configurations. Electrical connection of the PCB 43 to the control terminal formed of the lead frame is effected by soldering of the electrode pad on the rear side of the PCB to the lead frame as in the cases of FIG. 13 and FIG. 15. Further, the sealing in of the entire body after the PCB 43 has been mounted in the present embodiment is carried out with polyphenylene-sulfide (PPS) 192 as a thermosetting resin. This is done because application of the transfer molding is difficult, since the external input and output terminal 190 is set upright on the PCB 43. On account of low fluidity of thermosetting resins, it is difficult to subject the power semiconductor element in which wire bonding is made to molding. However, no problem arises when the elements are previously sealed in with a thermosetting resin 16 as in the present embodiment.

Embodiment 10

The embodiments described in the foregoing are of a structure in which the lead frame is bent upright in the PKG, an exposed portion is formed on the upper side of the PKG, and the control circuit disposed in the top face of the PKG is connected thereto. The advantageous point in this structure is the ease of electrical connection for the lead frame with the control circuit. On the other hand, there are also disadvantages, when compared with the case where the lead frame is vertically bent simply only once outside the PKG, that the fabrication cost of the lead frame somewhat increases and transfer molding becomes difficult due to a problem with the accuracy of the bending. An embodiment in which such disadvantages are reduced is shown in FIG. 11 and FIG. 12.

FIG. 11 is a schematic diagram showing the cross-sectional structure. The power semiconductor element 14 is soldered to a lead frame 11 and electrically connected to the lead frame 11 with Al wires 15. The lead frame 11, the same as before, also serves as the power system terminal 12 and the control system terminal 13 and its thickness is 0.8 mm. The lead frame 11 having the power semiconductor elements 14 mounted thereon is subjected to transfer molding with a thermosetting resin 31 so that a PKG 112 is formed. The PKG 112 is different from that described in the foregoing. Namely, the lead frame 11 is not vertically bent within the PKG, but is taken out to the side face of the PKG 112 at the bottom side of the PKG. Onto the top face 111 of the PKG 112 there are soldered a bare chip gate drive IC 30 and a bare chip microcomputer 110. In the present embodiment, electrical interconnections of the control circuit elements and the control system lead frame are carried out by a three-dimensional copper-plated wiring.

A perspective view of the present embodiment with the interior of the module partly exposed is shown in FIG. 12. The copper plated wiring is laid out not only on the top face 111 of the PKG 112, but also on the side face, and it is connected to the control terminals 13 formed of the lead frame (wiring 120). Further, connections of the wiring 120 with the control circuit elements are made by gold wire bonding. After the control circuits have been connected with the power circuit portions, insulation between the same and the Al base 10 and sealing in of the entire body are performed with a thermosetting resin 32, the same as in the above described embodiments.

Thus, the structure of the lead frame can be simplified.

Embodiment 11

Figure 17:
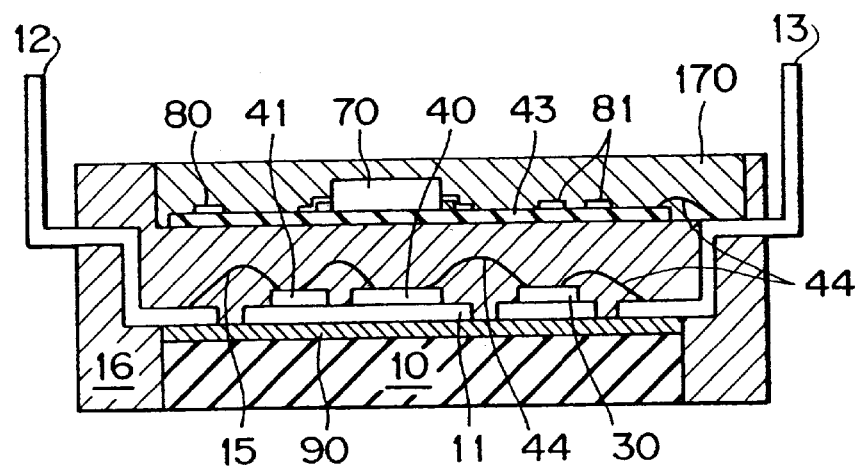
FIG. 17 is a schematic diagram of an embodiment in which a control circuit in the second tier is sealed by potting.

FIG. 17 schematically shows a cross-sectional structure of another embodiment.

The IGBT 40 and the FWD 41 are soldered onto a lead frame 11 and the bare chip gate drive IC 30 is also soldered onto the lead frame 11. The lead frame 11 is electrically connected with the IGBT 40 and the FWD 41 by supersonic wire bonding with the Al wire 15, and, further, the IGBT 40, the gate drive IC 30, and the lead frame are interconnected with the Al wire 44. The Al wires 15 and 44 are different in wire diameter. The Al wire 15 serving as the power system wiring requires a large current capacity and, hence, has a diameter of 300 $\mu$m, and the Al wire 44 for the control system has a smaller diameter than 300 $\mu$m, for example 100 $\mu$m. As in the embodiment 1, the power system terminal (main terminal) 12 and the input terminal (control terminal) 13 are formed of the lead frame 11 having the power semiconductor elements mounted thereon. Also, the thickness of the lead frame 11, the recess of a depth of 6 mm or so made in the upper face of the PKG, and the structure of the lead frame bent upright within the PKG, and the like are the same as in the embodiment 1. The connection of the PCB 43 having the MPU 70 mounted thereon with the control system lead frame is made in the same manner as in the case shown in FIG. 8.

The present embodiment has characteristics such that an insulation between the lead frame 11 and the Al base 10 is provided by the thermocompression insulating sheet shown in FIG. 9 and that potting with thermosetting resin 170 is made as the sealing means of the PCB 43 to which control circuit elements are connected and the recess is filled up with the resin 170. The method mentioned first above is used for reducing heat resistance while securing insulation between the lead frame 11 and the Al base 10 with a sealing resin, the same as in the case of FIG. 1, and the method mentioned second above is used for making the fabrication easier by employing a simplified method because such a high reliability in sealing is not required for the control circuit portion as is required for the power circuit portion.

Embodiment 12

Figure 18:
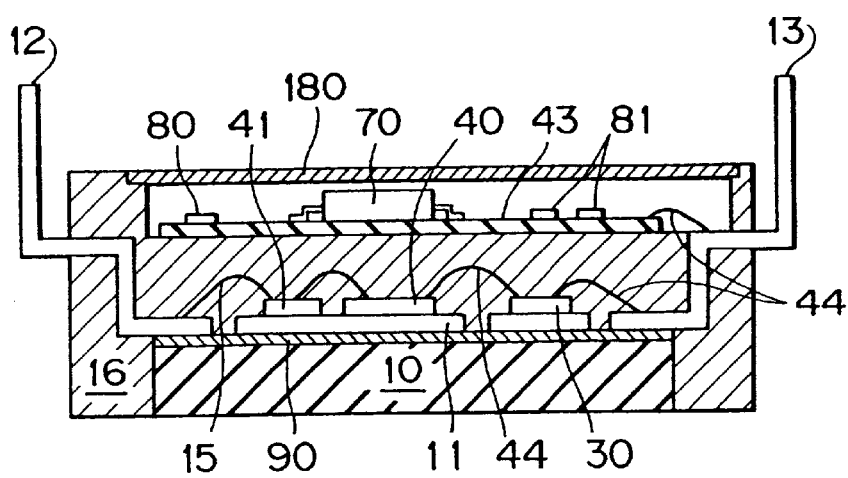
FIG. 18 is a schematic diagram of an embodiment in which the portion in the second tier is covered with a lid.

FIG. 18 shows a variation of the embodiment 11.

In the cases of embodiments 11 and 12, the gate drive IC 30 is mounted on the lead frame 11, and, hence, only low voltage elements such as the MPU 70 and chip resistor 80 are mounted on the PCB 43. Accordingly, a high voltage is not applied to the wiring of the PCB 43. Therefore, if a sufficient insulating distance is provided for the portion of the control terminal 13 which is partly supplied with high voltage, the space over the PCB 43 need not be resin-sealed. Accordingly, in the present embodiment, such a structure is adopted to have a lid 180 covering the recess fixed with an adhesive agent.

Embodiment 13

Figure 21:
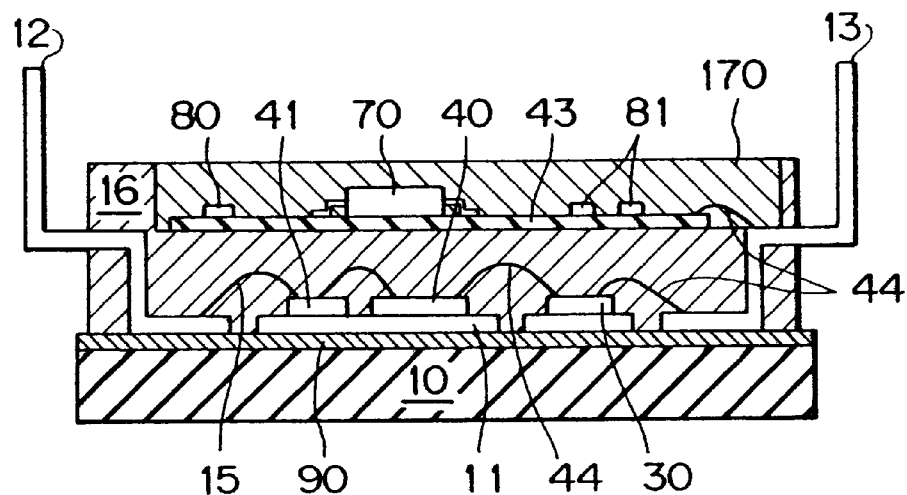
FIG. 21 is a schematic diagram of an embodiment in which the package is attached to a radiating plate.

FIG. 21 shows a variation of the embodiment 11.

In the embodiment 11, the lead frame having the power semiconductor element and the gate drive IC mounted thereon is bonded to the Al base through a thermocompression insulating sheet and the entire body is subjected to transfer molding. The key point of this method is the thermocompression bonding of the lead frame 11. Since the lead frame 11 is made by press work, it is difficult to make the pattern face completely flat. Since the rugged face of the pattern is pressed against the thermocompression insulating sheet 90 with only a thickness of 0.12 mm, the sheet 90 is partly broken and tends to cause the danger of shorting of the lead frame to the Al base 10. The structure of the present embodiment is designed to decrease such danger as much as practically possible.

The structure above the level of the lead frame 11 is the same as the embodiment shown in FIG. 17. In this embodiment, the portion having the lead frame 11 at the bottom face, not including the Al base 10, is subjected to transfer molding with a thermosetting resin 16. Hence, the side faces of the Al base 10 are not covered with the thermosetting resin. Since the lead frame 11 is pressed against a die at the time of the molding, its flatness is improved. Further, since most of the lead frame with a thickness of 0.8 mm is sealed in the PKG by molding, the danger of the thermocompression insulating sheet 90 being damaged by the edge of the lead frame can be decreased. Further, since in the present embodiment a Completed PKG is bonded to a radiating plate by thermocompression, it also has such a characteristic feature that the thickness of the radiating plate 10 can be changed at will according to such parameters as the current capacity or the loss occurring in the IGBTs and FWDs within the PKG. Further, radiating fins may be attached instead of the radiating plate 10.

Embodiment 14

Figure 10:
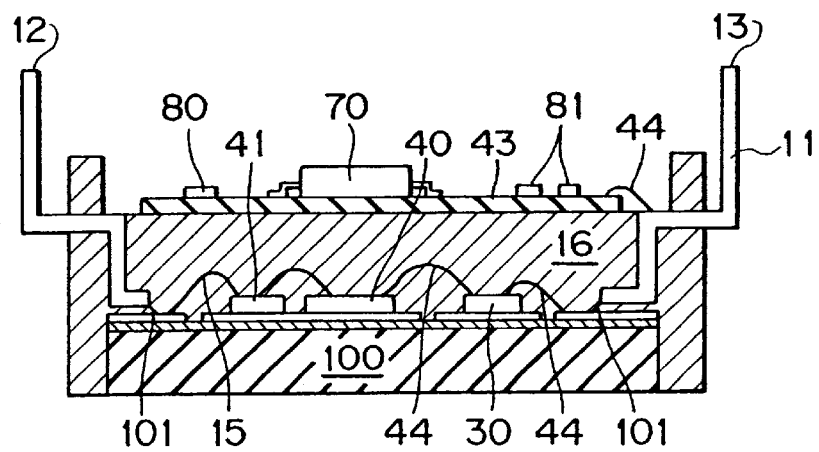
FIG. 10 is a schematic diagram of an embodiment in which a metal-core printed board is used.

The embodiments described above utilize a structure that has power semiconductor elements and gate drive ICs arranged on the lead frame and has the module subjected to transfer molding. When a module of a smaller capacity than a current capacity of 20 A is fabricated, a metal core printed circuit board (metal core PCB) in which the resin portion of the PCB is formed of a metal such as Al to improve the heat radiating characteristic is generally employed. FIG. 10 shows an embodiment using such a metal core PCB.

The board 100 at the bottom of the module is the metal core PCB. The metal core PCB is produced by having the copper foil of a thickness of about 80 μm bonded to and insulated from an Al plate by means of a resin sheet. The IGBT 40, the FWDs 41, and the bare chip gate drive IC 30 are soldered to the copper foil pattern on the metal core PCB 100. Electrical connections between the IGBT 40, the FWD 41, and the copper foil pattern through which the main current flows is made with an Al wire 15 having a wire diameter of 300 μm and wiring for the control system (between the IGBT 40, the gate drive IC 30, and the copper foil pattern) is made with an Al wire 44 having a wire diameter of 100 μm. The power system terminal 12 and the control terminal 13 formed of the lead frame are soldered to the circumference of the metal core PCB 100 having various semiconductor chips and others soldered thereto. In the present embodiment, the IGBT 40 and the FWD 41 are directly soldered to the copper foil pattern on the-metal core PCB 100. However, when it is an objective to further decrease the heat resistance, semiconductor chips are previously soldered to a copper plate (heat diffusing plate) having a thickness of 1 mm or so and the heat diffusing plate is soldered to the copper foil pattern. Through such arrangement, heat is diffused in the heat diffusing plate and, hence, the heat resistance is decreased. The power system terminal 12 and the control terminal 13 are set upright the same as in the above described embodiments and are subjected to transfer molding with a thermosetting resin 16. The same as before, a recess for mounting the control circuit thereon is formed in the top face of the PKG and part of the terminal 13 is exposed in the bottom face. It is characteristic of the present embodiment that it meets the requirement for provision of a fine pattern in the first tier portion of the transfer molded module enabling a higher level control IC and the like to be mounted thereon.

Embodiment 15

Figure 22:
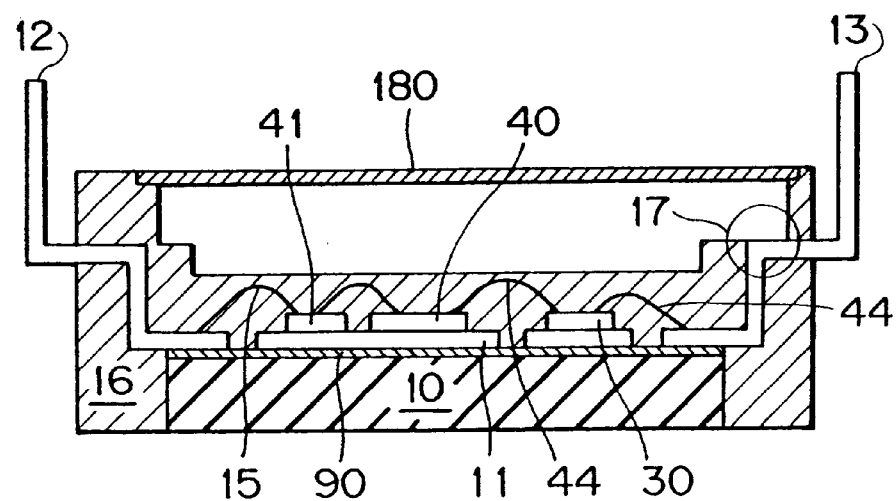
FIG. 22 is a schematic diagram of an embodiment in which a control circuit board is not mounted.

FIG. 22 shows an embodiment in which a control circuit board is not mounted in the second tier region. Basically, it has the structure of FIG. 18 having the control circuit board 43 removed therefrom. It is considered that some users of the power module require an IGBT module in which a region for mounting a control circuit board is secured instead of ordering power module manufacturers to fabricate and mount a user-designated control circuit on the module. The present embodiment is an example to meet such a requirement. A region 17 for connecting a control circuit thereto will be formed in a body and the same and a module lid 180, as a set, will be supplied to the user. Users may use the module by having a mounted control circuit board sealed in by potting as needed.

The difference between this type of module from modules of the prior art structure, in which a control circuit board is inserted and soldered to the terminals of the module, is that the power module can be made compact and, thereby, the apparatus can be made smaller in this structure.

Embodiment 16

An application of the high performance module described in the foregoing to a motor driving system will be described below.

FIG. 23 is an embodiment of a driving apparatus for a brushless motor chiefly used as the motor for an inverter air conditioner, a refrigerator, a washing machine, and the like. It is shown in a functional block diagram. A power source 233 of single phase 100 V or 200 V is converted into a DC voltage through a diode bridge 220 and a smoothing capacitor 224. The power supply voltage wiring (P wiring) 225 and the ground (N) wiring 226 are connected to a DC-DC converter 221, and, thereby, the gate driving power supply (15 V) 227 for the IGBT and the power supply (5 V) 228 for the system controlling MPU 223 are provided. The module 222 is the high performance module described in the foregoing, which incorporates, other than the power circuit portion constituting the three-phase inverter circuit, a gate drive IC with a protecting function, a bootstrap circuit, a basic function MPU for a PWM generating function and the like, and a circuit for generating 5 V from 15 V, and the like. A speed command signal 230 is input from a system control MPU 223 to the high performance module and the module 222 is controlled while a PWM signal 231 and a fault signal 229 are monitored and, thereby, the brushless motor 232 is controlled. Incidentally, the MPU 223 can be incorporated in the module 222.

By the use of the high performance module 222 as described above, the user is only required to control the speed command signal 230, whereby the control of the module is greatly simplified compared with the control of the IGBT driving signal (PWM signal) in the prior art and such a merit can be obtained that efforts can be concentrated on software and the like other than driving of the brushless motor 232.

Embodiment 17

Another embodiment of a brushless motor driving apparatus is shown in FIG. 24 in a functional block diagram like FIG. 23. Only the points thereof which are different from the arrangement of FIG. 23 will be described.

The present embodiment has a characteristic of an active converter module 234 and an inverter module 244. The module 234 incorporates, other than a diode bridge as the power circuit portion, a chopping circuit for shorting the P wiring 225 with the N wiring 226 for improving the power factor and the control IC of the chopping circuit. Hence, the module 234 is connected with a 5 V supply wiring 228 as the power supply for the control circuit. The inverter module 244 incorporates, other than the functions mentioned in the above-described embodiments, a DC-DC converter for generating a power supply of 15 V from the high voltage. Namely, the apparatus is self-supporting for the control voltages. Accordingly, no external control power supply is connected to the module 244.

The module 234 is controlled by a voltage command signal 236 while a trip signal 235 is detected.

The present embodiment has a characteristic in that the external wiring of the module 244 is largely simplified and the apparatus is made smaller because the module 244 provides the control power supplies for itself, not to mention that the power factor is improved and the noise is reduced.

Embodiment 18

Figure 25:
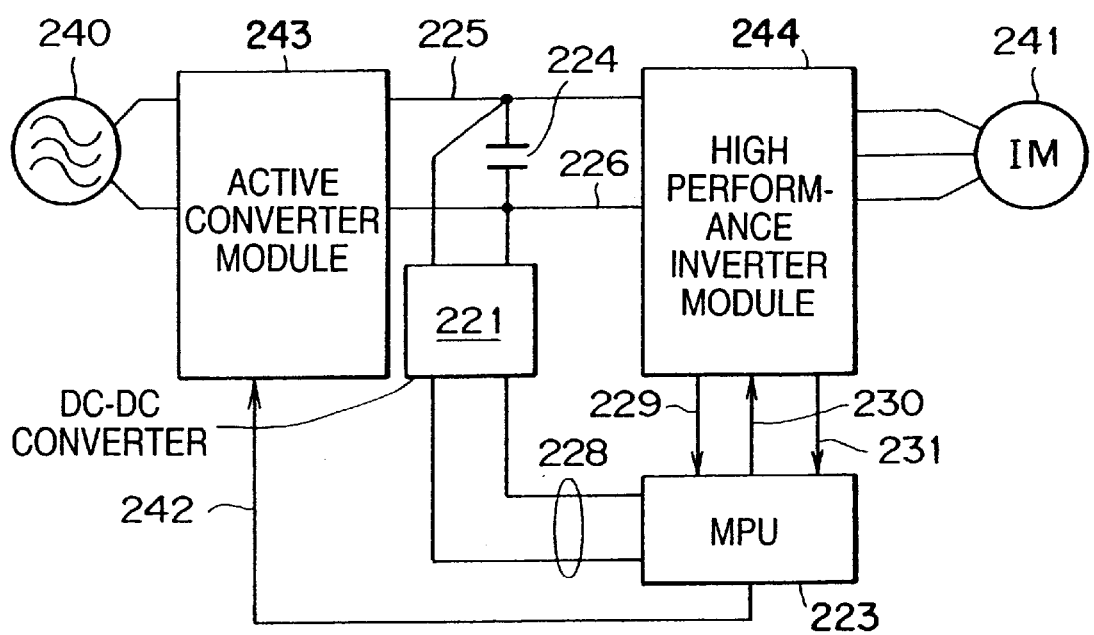
FIG. 25 is a block diagram an embodiment of an induction motor driving apparatus.

An embodiment of a driving apparatus of an induction motor 241 will be described with reference to FIG. 25 (functional block diagram).

A three-phase 200 V power supply is converted into a DC voltage (P wiring 225, N wiring 226) by using an active converter module 243 and a smoothing capacitor 224. The module 243 is a high performance module comprising an active converter circuit as a power circuit portion made up of six sets of FWDs and IGBTs in inverse-parallel connection like the three-phase inverter module, a gate drive IC, a control MPU therefor, a DC-DC converter for generating a control voltage of 15 V from a high voltage, and a bootstrap circuit. The inverter portion is a high performance inverter module 244 providing the control power supply for itself as in the embodiment 17. Accordingly, the DC-DC converter 221 is used for generating the control power supply (5 V) only for the system controlling MPU 223. The control signal of the inverter module 244 is completely the same as in the embodiments described in the foregoing and the active converter module 243 is controlled by a converter control signal 242.

According to the present system configuration, although the system is of a high performance configuration employing IGBTs for both the converter and the inverter, each module can be fabricated so as to be very compact. Therefore, the apparatus can be made much smaller than the apparatus of the prior art.

According to the present invention, it becomes possible to realize a power semiconductor module attaining a higher performance at low cost or with high reliability.

What is claimed is:

1. A power semiconductor module having a power circuit portion and a control circuit portion for controlling said power circuit portion, comprising:

a metal base;

a power semiconductor element included in said power circuit portion and mounted on said metal base through an insulator;

a first resin molded to said power semiconductor element such that the surface of said metal base is exposed;

a control circuit element included at least in a portion of said control circuit portion and disposed on said first resin;

a main terminal connected with said power circuit portion and led to the outside of said first resin; and a control terminal connected with said power circuit portion and having its portion exposed in the surface of said first resin, wherein said portion of said control circuit portion is connected with said power circuit portion at said exposed potion of said control terminal.

2. A power semiconductor module according to claim 1, wherein said first resin has a recess and said control circuit element is disposed on the bottom face of said recess.

3. A power semiconductor module according to claim 2, wherein a second resin is further filled in said recess.

4. A power semiconductor module according to claim 2, further comprising a lid for covering said recess.

5. A power semiconductor module according to claim 1, wherein said power semiconductor element is bonded onto a lead frame and said lead frame is mounted on said metal base through said insulator.

6. A power semiconductor module according to claim 5, wherein said main terminal and said control terminal are constituted of part of said lead frame.

7. A power semiconductor module according to claim 5, wherein said insulator is constituted of a resin sheet and the side face of said metal base is exposed.

8. A power semiconductor module according to claim 1, wherein said insulator is constituted of part of said first resin.

9. A power semiconductor module according to claim 1, wherein said first resin is fabricated by transfer molding.

10. A power semiconductor module according to claim 1, wherein said control circuit element is bonded to a circuit board and an electrode on said circuit board is electrically connected with said exposed portion of said control terminal.

11. A power semiconductor module according to claim 10, further comprising another control circuit element bonded to said circuit board on the side opposite to the side of said circuit board to which said control circuit element is bonded.

12. A power semiconductor module according to claim 10, wherein said electrode on said circuit board and said exposed portion of said control terminal are connected with each other by soldering.

13. A power semiconductor module according to claim 10, further comprising an external terminal attached onto said circuit board.

14. A power semiconductor module according to claim 1, further comprising a second resin molded to said control circuit element and said first resin.

15. A power semiconductor module according to claim 14, wherein said insulator is constituted of part of said second resin.

16. A power semiconductor module according to claim 14, wherein said second resin is fabricated by transfer molding.

17. A power semiconductor module according to claim 1, further comprising another control circuit element mounted on said metal base through said insulator and subjected to molding with said first resin.

18. A power semiconductor module according to claim 1, wherein said portion of said control circuit portion is connected with said power circuit portion by a metallic wiring disposed on said first resin.

19. A power semiconductor module according to claim 1 or 5, wherein said insulator is constituted of a resin sheet.

20. A motor driving system comprising an electric motor and an inverter for driving said electric motor, wherein said inverter is constituted of a power semiconductor module in which said power circuit portion according to claim 1 is an inverter circuit.

21. A motor driving system according to claim 20, further comprising a converter connected to said inverter, wherein said converter is constituted of a power semiconductor module in which said power circuit portion according to claim 1 is a diode bridge.

22. A motor driving system according to claim 20, further comprising a converter connected to said inverter, wherein said converter is constituted of a power semiconductor module in which said power circuit portion according to claim 1 is an active converter circuit.

23. A power semiconductor module comprising:
   a metal base;
   a power circuit portion including a power semiconductor element and disposed on said metal base through an insulator;
   a first resin molded to said power semiconductor element such that the surface of said metal base is exposed;
   a main terminal connected to said power circuit portion and taken to the outside of said first resin; and
   a control terminal connected to said power circuit portion and having an exposed portion in the surface of said first resin for connecting a control circuit portion to said power circuit portion.

* * * * *